(12) United States Patent
Kaji et al.

(10) Patent No.: US 11,107,756 B2
(45) Date of Patent: Aug. 31, 2021

(54) SEMICONDUCTOR DEVICE AND METHOD FOR MANUFACTURING THE SAME, AND POWER CONVERSION DEVICE

(71) Applicant: Mitsubishi Electric Corporation, Chiyoda-ku (JP)

(72) Inventors: Yusuke Kaji, Chiyoda-ku (JP); Hodaka Rokubuichi, Chiyoda-ku (JP); Satoshi Kondo, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 170 days.

(21) Appl. No.: 16/489,776

(22) PCT Filed: Dec. 6, 2017

(86) PCT No.: PCT/JP2017/043784
§ 371 (c)(1),
(2) Date: Aug. 29, 2019

(87) PCT Pub. No.: WO2018/185974
PCT Pub. Date: Oct. 11, 2018

(65) Prior Publication Data
US 2020/0020622 A1   Jan. 16, 2020

(30) Foreign Application Priority Data

Apr. 6, 2017  (JP) .............................. JP2017-076014

(51) Int. Cl.
*H01L 23/498* (2006.01)
*H01L 21/56* (2006.01)
(Continued)

(52) U.S. Cl.
CPC ........ *H01L 23/49811* (2013.01); *H01L 21/56* (2013.01); *H01L 23/3121* (2013.01);
(Continued)

(58) Field of Classification Search
None
See application file for complete search history.

(56) References Cited

U.S. PATENT DOCUMENTS

2020/0020622 A1* 1/2020 Kaji .................. H01L 23/49811

FOREIGN PATENT DOCUMENTS

| JP | 2016-9718 A | 1/2016 |
|---|---|---|
| WO | WO 2007/060854 A1 | 5/2007 |

OTHER PUBLICATIONS

International Search Report dated Feb. 27, 2018 in PCT/JP2017/043784 filed Dec. 6, 2017.

* cited by examiner

*Primary Examiner* — Jack S Chen
(74) *Attorney, Agent, or Firm* — Xsensus LLP

(57) ABSTRACT

A semiconductor device includes an insulating substrate, a semiconductor element, a conductor substrate, and a case member. The semiconductor element is connected above the insulating substrate, and the conductor substrate is connected above the semiconductor element. The case member surrounds a region overlapping with the insulating substrate, the semiconductor element, and the conductor substrate in plan view to avoid the region. A plurality of metal patterns are arranged on a main surface of an insulating layer. A groove is formed between a pair of adjacent metal patterns of the plurality of metal patterns. A through hole is formed in the conductor substrate at a position overlapping with the groove in plan view.

20 Claims, 7 Drawing Sheets

(51) Int. Cl.
*H01L 23/31* (2006.01)
*H01L 23/00* (2006.01)
*H01L 25/07* (2006.01)
*H02M 7/00* (2006.01)
*H02M 7/5387* (2007.01)
*H01L 23/14* (2006.01)
*H02P 27/08* (2006.01)

(52) U.S. Cl.
CPC ........ *H01L 23/49838* (2013.01); *H01L 24/32* (2013.01); *H01L 24/33* (2013.01); *H01L 25/072* (2013.01); *H02M 7/003* (2013.01); *H02M 7/53871* (2013.01); *H01L 23/142* (2013.01); *H01L 2224/32225* (2013.01); *H01L 2224/32245* (2013.01); *H01L 2224/33181* (2013.01); *H02P 27/08* (2013.01)

SEMICONDUCTOR DEVICE AND METHOD FOR MANUFACTURING THE SAME, AND POWER CONVERSION DEVICE

CROSS-REFERENCE TO RELATED APPLICATIONS

This application is a United States national stage application of International Application No. PCT/JP2017/043784, filed Dec. 6, 2017, which designates the United States, and claims priority to Japanese Patent Application No. 2017-076014, filed Apr. 6, 2017, and the entire contents of each of the above applications are hereby incorporated herein by reference in entirety.

TECHNICAL FIELD

The present invention relates to a semiconductor device and a method for manufacturing the same. In particular, the present invention relates to a power semiconductor device having an insulating substrate, a conductor substrate, and a semiconductor element sandwiched therebetween, and a method for manufacturing the same. In addition, the present invention relates to a power conversion device to which the power semiconductor device is applied.

BACKGROUND ART

Inverter devices mounted in industrial apparatuses and automobiles are required to achieve further higher performance and downsizing. Accordingly, the same requirements are being imposed on semiconductor devices included in the inverter devices and involved in driving the inverter devices. When downsizing a semiconductor device, it is conceivable to make improvement such as downsizing a semiconductor element or increasing the amount of current passed to a semiconductor element. Generally, to connect a circuit in a semiconductor device, a thick aluminum wire or the like having a circular cross section with a diameter of about 0.5 mm is used. As a current for driving the semiconductor device increases, the amount of heat generated by the wire significantly increases. Thus, as a method for dealing with an increase in the current for driving the semiconductor device, there has been proposed a semiconductor device in which, instead of the wire described above, a conductor substrate such as copper or a circuit substrate including the same is placed above a semiconductor element to allow passage of a larger current when compared with the wire.

However, in the semiconductor device in which the conductor substrate or the circuit substrate including the same is placed above the semiconductor element, a narrow portion is formed between an insulating substrate below the semiconductor element and the conductor substrate above the semiconductor element, and it is difficult to fill a sealant such as resin into the narrow portion. Accordingly, for example, International Publication No. 2007/060854 (PTL 1) and Japanese Patent Laying-Open No. 2016-9718 (PTL 2) present proposals to improve filling properties into a region to be sealed with resin by providing a filling path in a configuration in which another component is mounted above the region to be sealed with resin.

CITATION LIST

Patent Literature

PTL 1: International Publication No. 2007/060854
PTL 2: Japanese Patent Laying-Open No. 2016-9718

SUMMARY OF INVENTION

Technical Problem

However, in a method disclosed in International Publication No. 2007/060854, there is only one opening provided to supply a light emitting material as the resin. Although the light emitting material supplied from the opening is filled into the region to be sealed, if a portion in which the light emitting material is not filled remains in a portion of the region to be sealed, such an unfilled portion is not supplied with the light emitting material from other portions and is not supplemented. Thus, there is a concern that the unfilled portion may remain in a portion of the region to be sealed.

In addition, in a semiconductor device disclosed in Japanese Patent Laying-Open No. 2016-9718, a region above a semiconductor element is completely covered with a case member. Thus, in a case where minute air bubbles remain in the resin filled in a resin injection step during manufacturing of the semiconductor device, the minute air bubbles may be unable to be removed merely by an air vent hole formed at a portion of the case member of the semiconductor device. Although an insulating layer for ensuring insulating properties of the semiconductor device is present on the case member above the semiconductor element, damage to the insulating layer is a concern when the air bubbles remain in the region above the semiconductor element.

The present invention has been made in view of the aforementioned problems, and an object thereof is to provide a semiconductor device capable of suppressing remaining of minute air bubbles produced in a resin injection step and facilitating flowing of a sealant into a region to be sealed with resin, a method for manufacturing the same, and a power conversion device having such a semiconductor device.

Solution to Problem

A semiconductor device in accordance with the present invention includes an insulating substrate, a semiconductor element, a conductor substrate, and a case member. The insulating substrate includes an insulating layer. The semiconductor element is connected above the insulating substrate. The conductor substrate is connected above the semiconductor element. The case member surrounds a region overlapping with the insulating substrate, the semiconductor element, and the conductor substrate in plan view to avoid the region. A plurality of metal patterns are arranged to be spaced from each other on a main surface of the insulating layer. A groove is formed between a pair of adjacent metal patterns of the plurality of metal patterns. A through hole is formed in the conductor substrate at a position overlapping with the groove in plan view. A sealant is filled into the region surrounded by the case member.

In a method for manufacturing a semiconductor device in accordance with the present invention, first, a conductor substrate is joined above an insulating substrate including an insulating layer to sandwich a semiconductor element therebetween. The insulating substrate, the semiconductor element, and the conductor substrate are placed to be surrounded by a case member. The semiconductor element is sealed by supplying a sealant into a region surrounded by the case member. The case member surrounds the region overlapping with the insulating substrate, the semiconductor element, and the conductor substrate in plan view to avoid the region. A plurality of metal patterns are formed to be spaced from each other on a main surface of the insulating layer. A groove is formed between a pair of adjacent metal patterns of the plurality of metal patterns. A through hole is formed in the conductor substrate at a position overlapping with the groove in plan view.

Advantageous Effects of Invention

According to the present invention, the case member surrounds the region overlapping with the conductor substrate and the like in plan view to avoid the region, suppressing remaining of minute air bubbles produced in a resin injection step. Since the through hole is formed at the position overlapping with the groove formed by the metal patterns in plan view, the sealant easily flows into a desired region, suppressing remaining of an unfilled portion.

DESCRIPTION OF EMBODIMENTS

Hereinafter, embodiments of the present invention will be described based on the drawings.

First Embodiment

Figure 1:
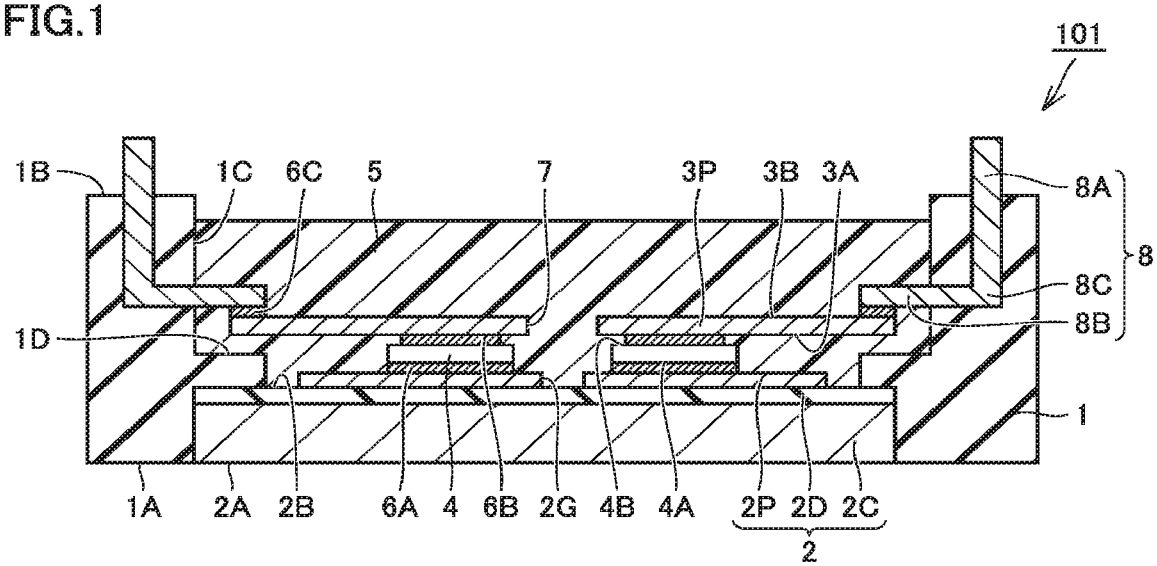
FIG. 1 is a schematic cross sectional view showing a configuration of a semiconductor device in a first embodiment.

First, a configuration of a semiconductor device in the present embodiment will be described using FIGS. 1 to 3. It should be noted that FIG. 1 is a cross sectional view taken along a line extending in the right-left direction in plan views of FIGS. 2 and 3, and the right-left direction in FIG. 1 substantially corresponds to the right-left direction in FIGS. 2 and 3. However, since semiconductor elements 4 are arranged in such a positional relation that they are slightly misaligned with respect to the right-left direction in FIGS. 2 and 3, FIG. 1 shows a configuration obtained by partially modifying the plan views of FIGS. 2 and 3 such that the semiconductor elements are arranged along the right-left direction.

Figure 2:
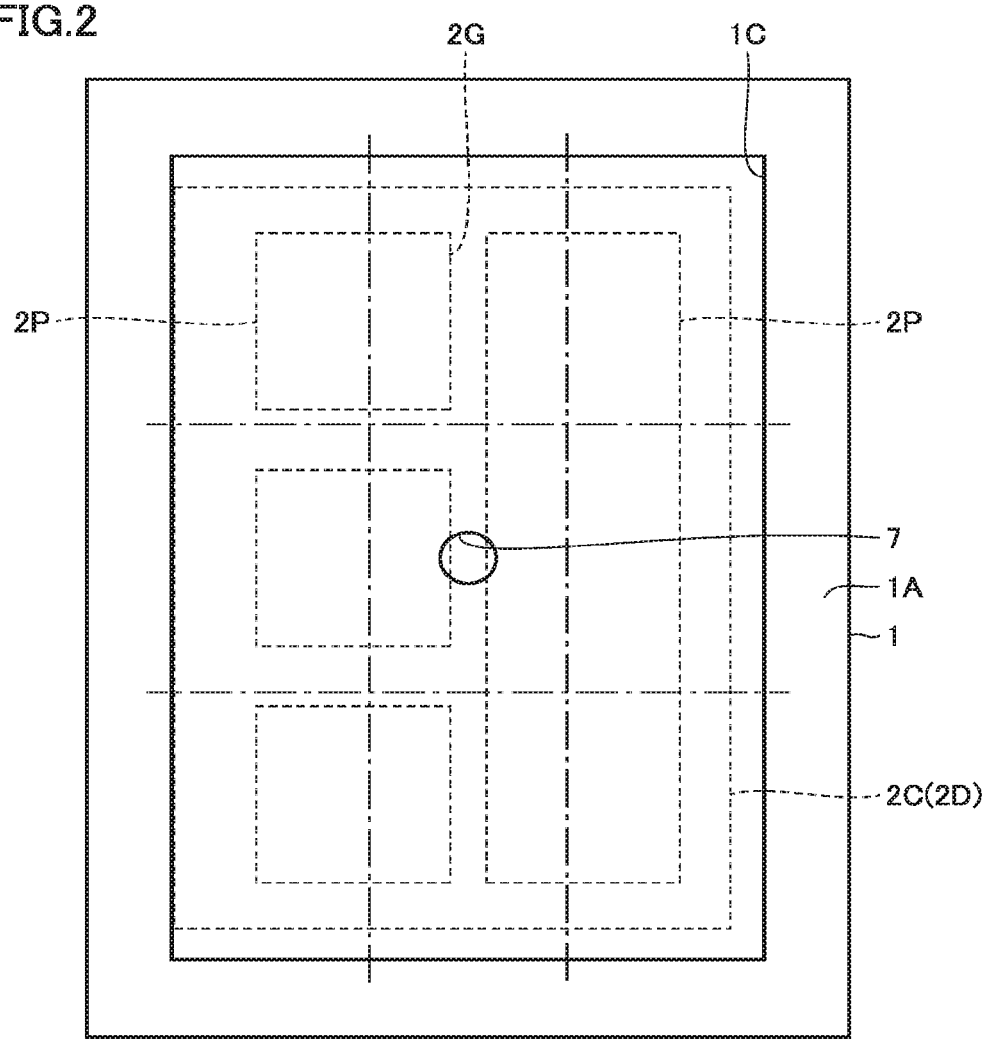
FIG. 2 is a schematic plan view showing a configuration of a semiconductor device of the present invention, showing only some components of the semiconductor device shown in FIG. 1.
Figure 3:
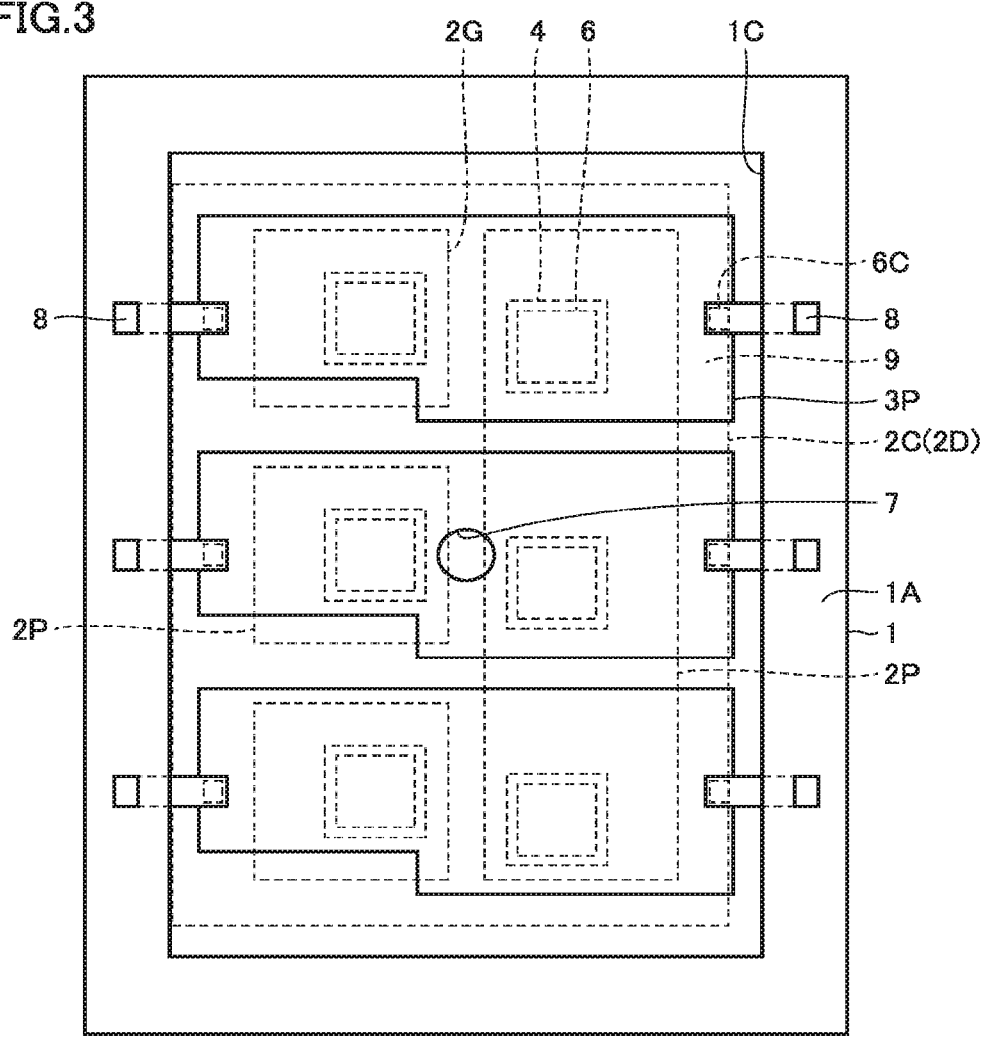
FIG. 3 is a schematic plan view showing the configuration of the semiconductor device of the present invention, showing the components of the semiconductor device shown in FIG. 1 in more detail than FIG. 2.

Referring to FIGS. 1 to 3, a semiconductor device 101 in the present embodiment is a semiconductor power module widely used for home electric appliances, for industrial purposes, for automobiles, or the like. Semiconductor device 101 mainly includes a case member 1, an insulating substrate 2 as a first insulating substrate, conductor substrates 3P, semiconductor elements 4, and a sealant 5 filled into case member 1. Case member 1 has a rectangular frame shape in plan view, and surrounds a region overlapping with insulating substrate 2, conductor substrates 3P, and semiconductor elements 4 in plan view to avoid the region. However, as described later, placement portions 1F as portions of case member 1 are placed on insulating substrate 2, and thus may partially overlap therewith.

As shown in particular in FIG. 1, insulating substrate 2 includes a heat dissipation metal plate 2C, an insulating layer 2D stacked on heat dissipation metal plate 2C, and metal patterns 2P formed on portions of insulating layer 2D. As shown in particular in FIGS. 2 and 3, insulating substrate 2 has a rectangular planar shape, for example. In other words, one main surface 2A and the other main surface 2B of insulating substrate 2 have a rectangular shape as shown in FIG. 1. Therefore, both heat dissipation metal plate 2C and insulating layer 2D have a rectangular flat plate shape.

In FIG. 1, for example, a surface obtained by connecting lowermost portions of insulating substrate 2 is indicated as one main surface 2A, and a surface obtained by connecting uppermost portions of insulating substrate 2 is indicated as the other main surface 2B. Therefore, the other main surface 2B is an uppermost surface of metal pattern 2P in a region where metal pattern 2P is formed, and is an uppermost surface of insulating layer 2D in a region where metal pattern 2P is not formed.

That is, in semiconductor device 101, a plurality of metal patterns 2P are arranged to be spaced from each other on a main surface of insulating layer 2D as a portion of insulating substrate 2, namely, on the other main surface 2B of insulating layer 2D. Since the plurality of metal patterns 2P are formed to be spaced from each other on portions of the other main surface 2B of insulating layer 2D, sizes thereof in plan view are smaller than those of heat dissipation metal plate 2C and insulating layer 2D. Preferably, metal pattern 2P also has a rectangular planar shape, as with heat dissipation metal plate 2C and insulating layer 2D.

Insulating layer 2D is required to have both heat dissipation properties and insulating properties. Specifically, insulating layer 2D is preferably made of a cured resin having a ceramic material embedded in a resin material. However, insulating layer 2D may be made of a ceramic material alone. In addition, as a powder material constituting the ceramic material used for insulating layer 2D, any one selected from the group consisting of alumina ($Al_2O_3$), silicon dioxide ($SiO_2$), aluminum nitride (AlN), and boron nitride (BN) is preferably used mainly. However, the powder material is not limited thereto, and any one selected from the group consisting of silicon nitride ($Si_3N_4$), diamond, silicon carbide (SiC), and boron oxide ($B_2O_3$) may be used as the powder material constituting the ceramic material used for insulating layer 2D. Further, a resin powder material such as a silicone resin or an acrylic resin may be used as the powder material.

Preferably, ceramic powder for insulating layer 2D has a spherical shape. However, the shape thereof is not limited thereto, and may be any one selected from the group consisting of a fractured shape, a granular shape, a scale-like shape, and an aggregate. The fill amount of the ceramic powder contained in insulating layer 2D only has to be enough to allow insulating layer 2D to have heat dissipation properties and insulating properties required thereto.

As the resin material used for insulating layer 2D, an epoxy resin is usually used. However, the resin material is not limited thereto, and the resin material used for insulating layer 2D may be any one selected from the group consisting of a polyimide resin, a silicone resin, and an acrylic resin. That is, any resin material having both insulating properties and adhesiveness can be used for insulating layer 2D.

In insulating substrate 2, insulating layer 2D is preferably joined to heat dissipation metal plate 2C as a metal plate to be integrated therewith. By using such an insulating substrate 2, the number of members can be reduced, and the process for manufacturing insulating substrate 2 can be simplified.

Heat dissipation metal plate 2C is a member for dissipating heat generated during driving of semiconductor elements 4, to the outside of semiconductor device 101, that is, downward from one main surface 2A.

Metal pattern 2P is a thin film made of a metal such as copper, for example, formed on insulating layer 2D made of resin, as shown. Metal pattern 2P is electrically connected to an external connection terminal or the like not shown arranged thereabove, and is also electrically connected to semiconductor element 4.

As shown in particular in FIGS. 2 and 3, metal pattern 2P is separated into two parts in the right-left direction in the drawings, and left-half metal pattern 2P of the two parts separated as described above is further separated into three parts in the up/down direction. The two parts in the right-left direction indicate a P side and an N side of semiconductor device 101. Here, the left side may be the P side and the right side may be the N side, and vice versa. Further, the three parts of left-half metal pattern 2P are respectively provided for a U phase, a V phase, and a W phase. That is, three semiconductor elements 4 joined immediately above the three parts of metal pattern 2P are respectively used for the U phase, the V phase, and the W phase.

A groove 2G is formed between a pair of adjacent metal patterns 2P of the plurality of metal patterns 2P separated as described above. Groove 2G is formed to linearly extend in plan view between the pair of adjacent metal patterns 2P.

Semiconductor element 4 is a member equipped with a power element such as an IGBT (Insulated Gate Bipolar Transistor) which performs fast switching of a large current, or a reflux diode, for example. Semiconductor element 4 is a chip-shaped member made of a single crystal of silicon (Si) or silicon carbide (SiC), for example. However, semiconductor element 4 is not limited thereto, and semiconductor element 4 may be made of a so-called wide bandgap semiconductor having a bandgap wider than that of silicon, such as gallium nitride (GaN) or diamond, for example. In addition, the number of semiconductor elements 4 formed is not limited to the number shown in FIGS. 1 to 3, and can be any number required depending on the intended use.

Semiconductor element 4 has one main surface 4A as a lower main surface in FIG. 1, and the other main surface 4B as a main surface opposite to one main surface 4A, that is, as an upper main surface in FIG. 1. Semiconductor element 4 is connected above insulating substrate 2, especially above metal pattern 2P, by means of a first joint material 6A. That is, one main surface 4A of semiconductor element 4 is jointed to an uppermost surface of metal pattern 2P (the other main surface 2B of insulating substrate 2) by means of first joint material 6A.

In addition, conductor substrate 3P is connected above semiconductor elements 4. Conductor substrate 3P is a member having one main surface 3A as a lower main surface in FIG. 1, and the other main surface 3B as a main surface opposite to one main surface 3A, that is, as an upper main surface in FIG. 1, and having a rectangular planar shape as shown in FIG. 3, for example. In other words, one main surface 3A and the other main surface 3B of conductor substrate 3P have a rectangular shape as shown in FIG. 3. One main surface 3A of conductor substrate 3P is joined to the other main surface 4B of semiconductor element 4 by means of a second joint material 6B.

In conductor substrate 3P, a through hole 7 extending from one main surface 3A to the other main surface 3B opposite thereto is formed. As shown in FIGS. 2 and 3, through hole 7 is formed in conductor substrate 3P at a position overlapping with groove 2G formed by metal patterns 2P in plan view. As shown in FIGS. 2 and 3, through hole 7 preferably has a circular planar shape, for example. This is for inserting a nozzle for injecting sealant 5 into through hole 7 when sealant 5 is supplied into case member 1 as described later, and the nozzle can be easily inserted when through hole 7 has a circular planar shape. In addition, since the nozzle is inserted into through hole 7 as described above, through hole 7 preferably has a size larger than the diameter of the nozzle in plan view.

As shown in FIG. 2, case member 1 has a rectangular planar shape having long sides (in the up/down direction in FIG. 2) and short sides (in the right-left direction in FIG. 2). Through hole 7 in conductor substrate 3P is formed within a region (diagonally shaded in FIG. 2) which is arranged at the center when the long sides of case member 1 are each equally divided into three, and is arranged at the center when the short sides of case member 1 are each equally divided into three, of the region surrounded by case member 1 in plan view. In FIG. 2, lines equally dividing long-side sides and short-side sides of the region surrounded by case member 1 into three are indicated by alternate long and short dashed lines.

Semiconductor device 101 further includes an electrode terminal 8. Electrode terminal 8 is a member for enabling electrical connection between the inside and the outside of semiconductor device 101. That is, electrode terminal 8 enables input/output of an electric signal from/to semiconductor element 4 arranged in semiconductor device 101.

As shown in FIGS. 2 and 3, preferably, a plurality of electrode terminals 8 are arranged to be spaced from each other, to be partially embedded in portions constituting long sides of a frame shape portion of case member 1. In FIG. 3, two or three electrode terminals 8 are arranged to be adjacent to each other with respect to a long side direction.

As shown in FIG. 1, electrode terminal 8 has a vertically extending portion 8A extending in the up/down direction in FIG. 1 in which case member 1 extends, a horizontally extending portion 8B extending in the right-left direction in FIG. 1 along one main surface 3A of conductor substrate 3P and the like, and a bent portion 8C therebetween at which electrode terminal 8 is bent. Vertically extending portion 8A is mostly embedded in a main body portion of case member 1, and only an uppermost end portion thereof is exposed from case member 1. Vertically extending portion 8A exposed from case member 1 can be electrically connected to the outside of semiconductor device 101. In addition, of horizontally extending portion 8B, only a portion relatively close to bent portion 8C is embedded in the main body portion of case member 1, and the remaining large portion is exposed therefrom and is arranged in the region surrounded by case member 1. Then, the remaining large portion extends along a direction in which the short sides of case member 1 extend, and is electrically connected to conductor substrate 3P. As shown in FIG. 1, horizontally extending portion 8B of electrode terminal 8 is joined to conductor substrate 3P by means of a third joint material 6C, for example.

Heat dissipation metal plate 2C and metal pattern 2P of insulating substrate 2, conductor substrate 3P, and electrode terminal 8 are usually made of copper. However, the material therefor is not limited thereto, and any other conductor material having required heat dissipation properties can be used. For example, each of the members described above may be made of aluminum or iron, or may be made of a material obtained by mixing these materials (copper, aluminum, and iron) as appropriate. In addition, a composite material having stacked three layers of copper/invar/copper may be used as the material constituting each of the members described above. Alternatively, an alloy material such as SiCAl or CuMo may be used as the material constituting each of the members described above. Further, a nickel-plating film is usually formed on a surface of each of the members described above. However, the film formed is not limited to a nickel-plating film, and a gold-plating film or a tin-plating film may be formed, for example. Alternatively, a plating film does not have to be formed on the surface of each of the members described above, as long as a structure capable of supplying required current and voltage to the semiconductor element is provided. Furthermore, in the surfaces of metal pattern 2P, conductor substrate 3P, and electrode terminal 8, microscopic asperities may be provided to the surfaces to improve adhesiveness with sealant 5, and an adhesiveness improver may be supplied to the surfaces by priming. As the adhesiveness improver, any one selected from a silane coupling agent, polyimide, and an epoxy resin is preferably used. However, any material other than those described above may be used as an adhesiveness improver, as long as it is possible to improve adhesiveness between sealant 5 and the surfaces of metal pattern 2P, conductor substrate 3P, and electrode terminal 8.

In addition, a solder material is mainly used as first joint material 6A, second joint material 6B, and third joint material 6C. However, the joint materials are not limited thereto, and any material having desired electrical conductivity and strength is used. For example, a silver (Ag) or copper (Cu) sintered material may be used instead of solder, as first joint material 6A, second joint material 6B, and third joint material 6C.

Case member 1 has a shape like a box surrounding insulating substrate 2, conductor substrates 3P, semiconductor elements 4, and the like, by being arranged at an outermost portion of semiconductor device 101. Case member 1 is mainly made of PPS (PolyPhenylene Sulfide). However, the material therefor is not limited thereto, and a thermoplastic material such as LCP (Liquid Crystal Polymer) or PBT (PolyButylene Terephthalate) may be used. As case member 1, any material which is heat resistant and is rich in formability can be used.

Case member 1 has one main surface 1A constituting a lowermost portion FIG. 1 and the like, and the other main surface 1B constituting an uppermost portion in FIG. 1 and the like. A member made of the material described above extends therebetween in the up/down direction in FIG. 1, constituting the main body portion of case member 1. In addition, since case member 1 has a frame shape, case member 1 has inner wall surfaces 1C as surfaces facing the region surrounded by case member 1. Further, case member 1 has inner bottom surfaces 1D, in particular in a relatively downward region close to one main surface 1A. Inner bottom surface 1D is an uppermost portion of a region where the main body portion extends in the right-left direction in FIG. 2, that is, along one main surface 1A, in a lower portion of case member 1, and is formed as the other main surface constituting a bottom surface in the surrounded region. Of one main surface 1A of case member 1, an outermost portion in plan view is opposite to the other main surface 1B, and a portion inward therefrom is opposite to inner bottom surface 1D.

As shown in FIG. 1, placement portions 1F extend from inner wall surfaces 1C along the long sides of case member 1 (at least some of the inner wall surfaces), toward the region surrounded by case member 1. Placement portion 1F is a portion placed on the other main surface 2B of insulating substrate 2 to contact a portion (for example, an outermost portion) of the other main surface 2B in plan view in the relatively downward region close to one main surface 1A of case member 1.

Placement portions 1F of case member 1 contact portions of the other main surface 2B of insulating substrate 2, and lowermost portions (further below placement portions 1F) of inner wall surfaces 1C of case member 1 contact end surfaces of heat dissipation metal plate 2C as shown in FIG. 1. Case member 1 is joined to insulating substrate 2 at these contact portions, and thereby case member 1 and insulating substrate 2 constitute a container-like member. Therefore, at least a portion of the surfaces of insulating substrate 2 is bonded to the surfaces of case member 1, thereby constituting the container-like member as described above. Sealant 5 is filled into the region surrounded by case member 1 to fill the inside of the container-like member, that is, a region where conductor substrates 3P, semiconductor elements 4, and the like are arranged. In semiconductor device 101, insulating substrate 2 is arranged to cover the entire bottom portion of the container-like member, and case member 1 is arranged to constitute the entire side portions of the container-like member. Since the both members are bonded without any gap, sealant 5 can be injected into the container-like member so as not to leak therefrom.

Sealant 5 is a solidified gel-like material, for example, to fill a space in the container-like member. Specifically, for example, an epoxy resin is used as sealant 5. However, sealant 5 is not limited thereto, and any resin material having desired elastic modulus and heat resistance can be used. For example, any one selected from the group consisting of a silicone resin, a urethane resin, a polyimide resin, a polyamide resin, a polyamide imide resin, and an acrylic resin may be used as sealant 5, instead of an epoxy resin. Any material having both insulating properties and adhesiveness can be used as sealant 5.

Figure 4:
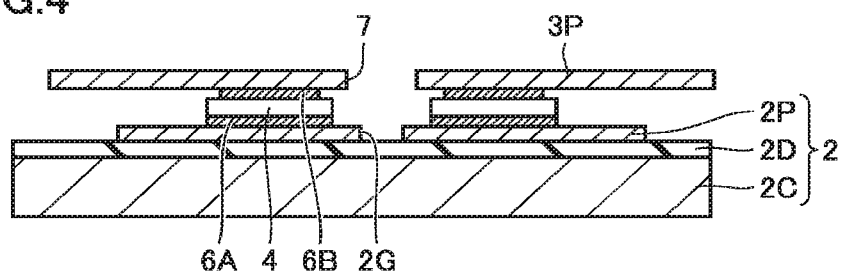
FIG. 4 is a schematic cross sectional view showing a first step of a method for manufacturing the semiconductor device in the first embodiment.
Figure 5:
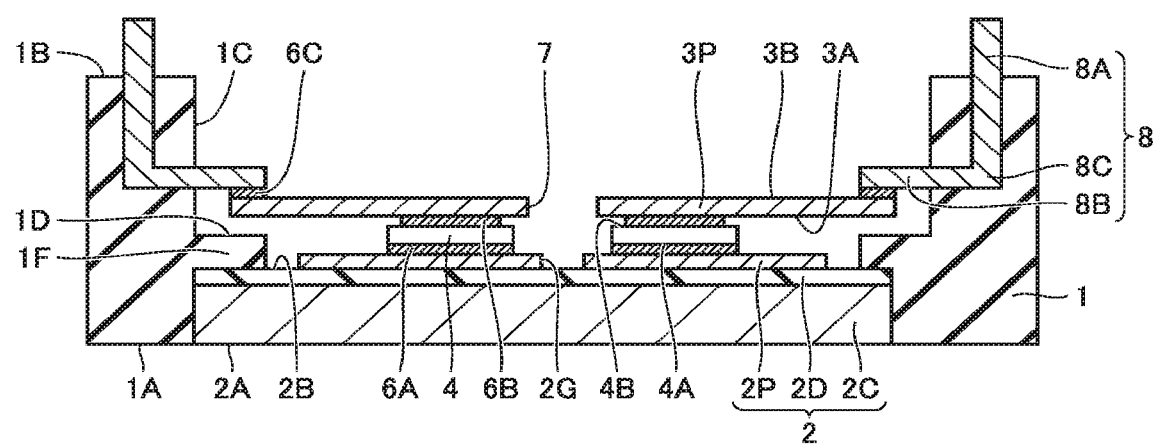
FIG. 5 is a schematic cross sectional view showing a second step of the method for manufacturing the semiconductor device in the first embodiment.
Figure 6:
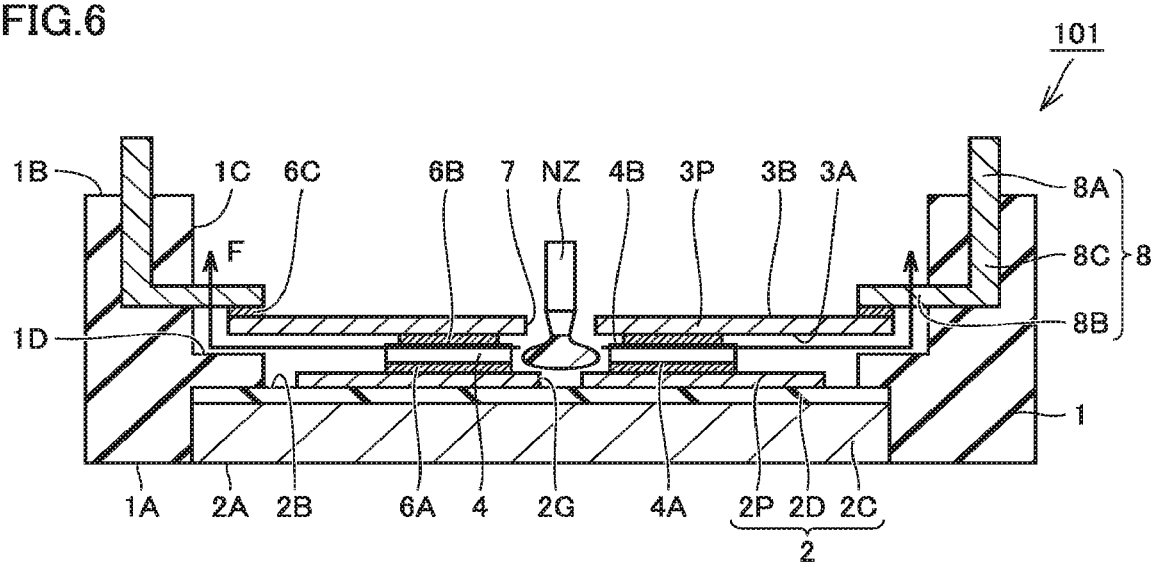
FIG. 6 is a schematic cross sectional view showing a third step of the method for manufacturing the semiconductor device in the first embodiment.

Next, a method for manufacturing semiconductor device 101 in the present embodiment will be briefly described using FIGS. 4 to 6.

Referring to FIG. 4, first, insulating substrate 2, conductor substrate 3P, and semiconductor elements 4 are prepared. It should be noted that metal patterns 2P of insulating substrate 2 preferably have a thickness of more than or equal to about 0.1 mm and less than or equal to about 1 mm. Metal patterns 2P are formed by forming a metal layer with the above film thickness on the other main surface 2B of insulating layer 2D using a commonly well-known printing method or the like, using press working, for example, and thereafter patterning the metal layer to have a desired planar shape using a commonly well-known photoengraving technique or the like. However, metal patterns 2P may be formed on the other main surface 2B of insulating layer 2D by first patterning a metal member to have desired planar shape and thickness and thereafter press working the metal member. Thus, the plurality of metal patterns 2P are arranged to be spaced from each other on the other main surface 2B of insulating layer 2D, and groove 2G is formed between a pair of adjacent metal patterns 2P of the plurality of metal patterns 2P.

In addition, conductor substrate 3P is constituted of only a flat plate made of a metal material such as copper, like a lead frame, for example. Conductor substrate 3P preferably has a thickness of more than or equal to 0.1 mm and less than or equal to 1 mm. In conductor substrate 3P, through hole 7 extending from one main surface 3A to the other main surface 3B opposite thereto is formed at a position eventually overlapping with groove 2G in plan view. As described above, the position at which through hole 7 is formed is within the region which is arranged at the center when each of the long sides and the short sides is equally divided into three, of the region surrounded by case member 1 in plan view.

Then, conductor substrate 3P is joined above insulating substrate 2 including insulating layer 2D to sandwich semiconductor elements 4 therebetween Specifically, for example, one main surface 4A of semiconductor element 4 is joined onto metal pattern 2P as an uppermost surface of insulating substrate 2, via first joint material 6A. In addition, the other main surface 4B of semiconductor element 4 is joined onto a lowermost surface of conductor substrate 3P, via second joint material 6B.

Referring to FIG. 5, a set of insulating substrate 2, conductor substrate 3P, and semiconductor elements 4 stacked on each other in the step of FIG. 4 is placed to be accommodated within a frame body of case member 1 to be surrounded by case member 1. Specifically, the set is particularly preferably placed to be fitted in case member 1, with the relatively downward region of case member 1 contacting end surfaces of insulating substrate 2, partial regions of the other main surface 2B adjacent the end surfaces, and the like which are portions of the surfaces of insulating substrate 2. When portions of the surfaces of case member 1 thereby contact the portions of the surfaces of insulating substrate 2 without any gap, case member 1 and insulating substrate 2 form a container-like member, and it becomes possible to supply sealant 5 or the like into the container-like member.

Case member 1 has a frame shape, and surrounds insulating substrate 2, semiconductor elements 4, and conductor substrate 3P to avoid a region overlapping with them in plan view (except for regions where placement portions 1F extend onto insulating substrate 2). Accordingly, case member 1 is arranged to expose insulating substrate 2, semiconductor elements 4, and conductor substrate 3P from case member 1 without covering them.

In addition, a portion of horizontally extending portion 8B exposed from case member 1, of each electrode terminal 8 mostly embedded in the main body portion of case member 1, is joined to the other main surface 3B of conductor substrate 3P by means of third joint material 6C.

Referring to FIG. 6, by supplying sealant 5 into the region inside the container-like member surrounded by case member 1 in the step of FIG. 5, the members such as insulating substrate 2, conductor substrate 3P, and semiconductor elements 4 within case member 1 are sealed. Specifically, for example, a nozzle NZ for supplying sealant 5 is inserted into through hole 7 formed in conductor substrate 3P, and sealant 5 in the form of a gel, for example, is injected from a tip of nozzle NZ. Since nozzle NZ is inserted with the tip facing downward, injected sealant 5 flows, for example, from below nozzle NZ, through a region above the other main surface 2B of insulating substrate 2, and then toward a region above the other main surface 3B of conductor substrate 3P, like a flow F indicated by arrows in the drawing. By the injection molding step described above, sealant 5 is arranged to fill the entire region within case member 1. Sealant 5 filling the inside of the container-like member formed of case member 1 and insulating substrate 2 is arranged as a solid member by solidification thereof.

Figure 7:
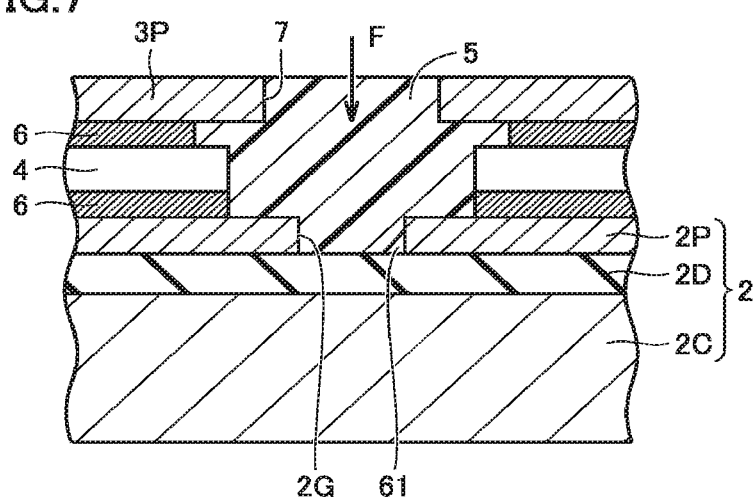
FIG. 7 is a schematic cross sectional view showing a mechanism for flowing a sealant from a through hole in an enlarged manner.

Next, the function and effect of the present embodiment and a more preferable configuration will be described with reference to FIGS. 7 and 8.

In semiconductor device 101 in the present embodiment, case member 1 surrounds a region overlapping with insulating substrate 2, conductor substrates 3P, semiconductor elements 4, and the like in plan view to avoid the region. That is, case member 1 does not cover a region above semiconductor elements 4 and the like. Accordingly, even when minute air bubbles remain in sealant 5 filled in the resin injection step (see FIG. 6) during manufacturing of the semiconductor device, the air bubbles can be released efficiently from a rectangular opening in the other main surface 1B of case member 1 toward above case member 1. In addition, since neither case member 1 nor an insulating layer and the like are present immediately above conductor substrate 3P, such a configuration can eliminate the possibility that a member arranged in a region immediately above conductor substrate 3P may be damaged by the air bubbles remaining in sealant 5.

Further, in semiconductor device 101 in the present embodiment, through hole 7 formed in conductor substrate 3P is arranged at a position overlapping with groove 2G formed by metal patterns 2P of insulating substrate 2 in plan view. Accordingly, when sealant 5 is injected into case member 1 using nozzle NZ inserted into through hole 7, sealant 5 injected from the tip of nozzle NZ immediately reaches groove 2G. Thus, by continuing injection of sealant 5, sealant 5 fills the inside of case member 1 while flowing through groove 2G along a direction in which it extends, that is, along the arrangement of metal patterns 2P. Thereby, an unfilled portion 61 not filled with sealant 5 in a region adjacent to metal pattern 2P as shown in FIG. 7 can be reduced, and thus more reliable semiconductor device 101 can be provided.

As shown in FIGS. 2 and 3, groove 2G is formed to linearly extend in plan view between the pair of adjacent metal patterns 2P. Accordingly, sealant 5 which has reached groove 2G can fill the inside of case member 1 while smoothly flowing through groove 2G along the arrangement of metal patterns 2P.

In addition, through hole 7 is arranged at the center when the long sides of the region surrounded by case member 1 are each equally divided into three, and is arranged at the center when the short sides of the region surrounded by case member 1 are each equally divided into three. Accordingly, variations in distance from through hole 7 to corner portions in case member 1 can be reduced. Therefore, since sealant 5 injected from through hole 7 flows radially therefrom, sealant 5 can entirely fill the inside of case member 1, including the corner portions therein when semiconductor device 101 is seen in plan view, without any gap. If it is assumed that through hole 7 is arranged at a corner portion in case member 1 in plan view, the difference in the distances from that corner portion to other corner portions is increased, and sealant 5 may be less likely to spread from that corner portion to a distant corner portion. However, such a concern can be eliminated by arranging through hole 7 at the center.

Figure 8:
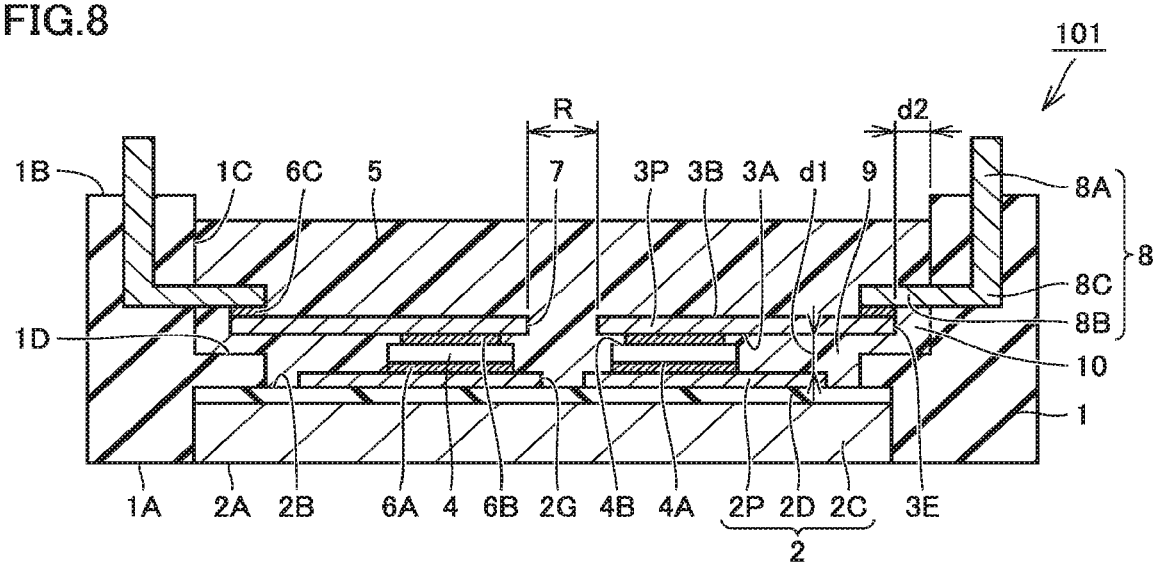
FIG. 8 is a schematic cross sectional view showing dimensions of portions in FIG. 1.

Referring to FIG. 8, in addition, in semiconductor device 101 of the present embodiment, through hole 7 through which nozzle NZ is inserted to supply sealant 5 preferably has a maximum width R of more than or equal to 1 mm and less than or equal to 10 mm in plan view. Here, when the planar shape of through hole 7 is a circle, the maximum width is the diameter of the circle, and when the planar shape of through hole 7 is an ellipse, the maximum width is a maximum width in the direction of the major axis of the ellipse. If the maximum width of through hole 7 is less than 1 mm, the cross sectional area of nozzle NZ is also reduced, and there may occur a defect that the injection speed of sealant 5 injected therefrom is reduced. If the maximum width of through hole 7 is more than 10 mm, sealant 5 may leak from through hole 7 needlessly. Accordingly, the size of through hole 7 is preferably within the range described above. Particular preferably, the maximum width of through hole 7 in plan view is more than or equal to 2 mm and less than or equal to 5 mm, of the range described above.

In addition, in the present embodiment, sealant 5 is injected from through hole 7 provided in conductor substrate 3P. Thereby, a space in which sealant 5 can flow is limited to a narrow portion 9 which is a region sandwiched between conductor substrate 3P and insulating substrate 2 (regions where semiconductor elements 4 are arranged, regions adjacent to those regions, and the like). That is, sealant 5 supplied into case member 1 spreads such that it preferentially flows through narrow portion 9. Accordingly, sealant 5 can preferentially fill narrow portion 9. From the viewpoint of improving filling properties of sealant 5 into narrow portion 9, the height of narrow portion 9 in the up/down direction in FIG. 8, that is, a minimum spacing between conductor substrate 3P and insulating substrate 2 (metal pattern 2P), that is, a distance d1 with respect to the up/down direction in FIG. 8, is preferably more than or equal to 0.2 mm and less than or equal to 3 mm. If distance d1 is less than 0.2 mm, filling properties of sealant 5 are deteriorated, and if distance d1 is more than 3 mm, it is difficult to mount semiconductor elements 4 and the like.

Since semiconductor elements 4 are arranged in narrow portion 9, narrow portion 9 is a portion which significantly influences the reliability of entire semiconductor device 101. Accordingly, the reliability of entire semiconductor device 101 can be further enhanced by filling sealant 5 into entire narrow portion 9 without any gap.

Semiconductor device 101 is an open system in which an upper portion of case member 1 has an opening, and an opening 10 is provided between end surfaces 3E of conductor substrate 3P and inner wall surfaces 1C of case member 1. After narrow portion 9 is entirely filled with sealant 5 in a resin sealing step using sealant 5 or the like, sealant 5 moves upward and flows through opening 10 as indicated by arrows F in FIG. 6. Further thereafter, sealant 5 moves upward from opening 10 as indicated by arrows F in FIG. 6, and sealant 5 can be filled onto conductor substrate 3P.

Here, the dimension of opening 10, that is, a distance d2 between end surface 3E of conductor substrate 3P and inner wall surface 1C of case member 1, in the right-left direction in FIG. 8 which is a direction along the main surface of insulating layer 2D, for example, is preferably more than or equal to 0.25 mm and less than or equal to 3 mm. If distance d2 is less than 0.25 mm, it becomes impossible to absorb a dimension error during assembly of the members (see FIG. 5). If distance d2 is more than 3 mm, flowing resin into opening 10 is prioritized over filling narrow portion 9 and sealant 5 is less likely to be supplied into narrow portion 9, and thus it becomes difficult to fill the entire region within case member 1 with sealant 5 without any gap. Accordingly, when distance d2 is set to be within the numeric value range described above, narrow portion 9 is entirely filled with sealant 5 without any gap, and thereby the reliability of entire semiconductor device 101 can be further enhanced.

Second Embodiment

Figure 9:
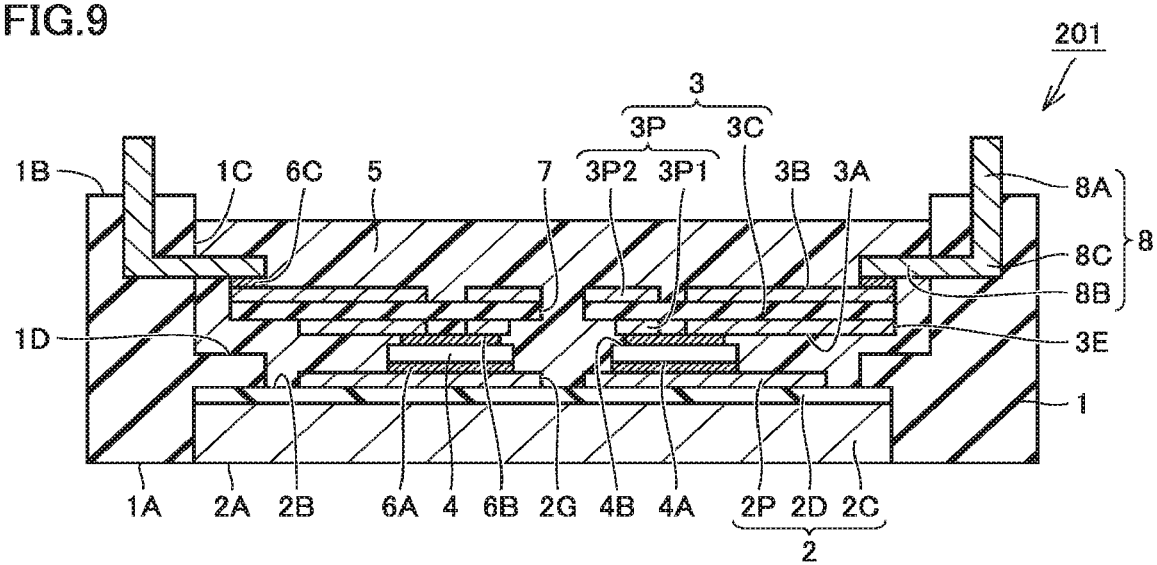
FIG. 9 is a schematic cross sectional view showing a configuration of a semiconductor device in a second embodiment.

Referring to FIG. 9, a semiconductor device 201 in the present embodiment basically has the same configuration as that of semiconductor device 101 in the first embodiment. Thus, identical components will be designated by the same reference numerals, and the description thereof will not be repeated. However, in semiconductor device 201, a conductor substrate 3P1 connected above semiconductor elements 4 constitutes an insulating substrate 3 as a second insulating substrate, together with other members. In this respect, semiconductor device 201 is different in configuration from semiconductor device 101 in the first embodiment in which conductor substrate 3P connected above semiconductor elements 4 is independent of other members and constitutes by itself a metal conductor member such as a lead frame.

Specifically, insulating substrate 3 is arranged immediately above insulating substrate 2 to be spaced therefrom, to planarly overlap with insulating substrate 2. Insulating substrate 3 has an insulating layer 3C, conductor substrate 3P1 formed on a lower main surface in FIG. 9 of insulating layer 3C, and a conductor substrate 3P2 formed on an upper main surface in FIG. 9 of insulating layer 3C. Here, a surface obtained by connecting lowermost portions of insulating substrate 3 in FIG. 9 is indicated as one main surface 3A, and a surface obtained by connecting uppermost portions of insulating substrate 3 is indicated as the other main surface 3B. Therefore, the other main surface 3B is an uppermost surface of conductor substrate 3P2 in a region where conductor substrate 3P2 is formed, and is an uppermost surface of insulating layer 3C in a region where conductor substrate 3P2 is not formed. It should be noted that the manner of arrangement of conductor substrate 3P2, such as the shape and the number thereof, is shown in a simplified fashion in FIG. 9, and may be actually different from the manner shown in FIG. 9.

Although conductor substrate 3P1 and conductor substrate 3P2 are joined to insulating layer 3C and integrated therewith, properties such as the material and thickness thereof are basically the same as those of conductor substrate 3P as a lead frame independently arranged in the first embodiment, and thus the description thereof will not be repeated here.

In the present embodiment, one main surface 4A of semiconductor element 4 is jointed to the uppermost surface of metal pattern 2P (the other main surface 2B of insulating substrate 2) by means of first joint material 6A, and one main surface 3A of insulating substrate 3 (conductor substrate 3P1) is joined to the other main surface 4B of semiconductor element 4 by means of second joint material 6B. In addition, conductor substrate 3P2 is joined to electrode terminal 8 by means of third joint material 6C.

In connecting semiconductor element 4 and conductor substrate 3P1, a resist agent may be provided in only a partial region of a lower main surface (one main surface 3A) of conductor substrate 3P1, to designate a connection range of second joint material 6B. In addition, the resist agent may be provided in only partial regions of not only the lower main surface of conductor substrate 3P1 but also the main surfaces of insulating layer 3C and an upper main surface (the other main surface 3B) of conductor substrate 3P2.

Insulating layer 3C is a flat plate member having a rectangular planar shape, as with other members. Since insulating layer 3C is basically made of the same material as that for insulating layer 2D of insulating substrate 2, the description thereof will not be repeated here. However, insulating layer 3C may be a glass epoxy substrate obtained by impregnating a stack of glass fiber cloths with an epoxy resin.

In the present embodiment, a minimum spacing between insulating substrate 2 and a conductor substrate is more than or equal to 0.2 mm and less than or equal to 3 mm. That is, in the present embodiment, of a plurality of conductor substrates 3P1 and 3P2, conductor substrate 3P1 is the conductor substrate closest to insulating substrate 2. Accordingly, a minimum spacing between insulating substrate 2 and conductor substrate 3P1 is preferably more than or equal to 0.2 mm and less than or equal to 3 mm.

In addition, in the present embodiment, a distance between end surface 3E of conductor substrate 3P1 (or conductor substrate 3P2) and inner wall surface 1C of case member 1, in the right-left direction in FIG. 8 which is a direction along the main surface of insulating layer 2D, for example, is preferably more than or equal to 0.25 mm and less than or equal to 3 mm.

Next, the function and effect of the present embodiment will be described. Since the function and effect of the present embodiment are basically the same as the function and effect of the first embodiment, the description of the same portion will not be repeated. An additional description will be given below.

Semiconductor device 201 in the present embodiment is configured by adding a wiring structure which is three-dimensional in the up/down direction in FIG. 9 to conductor substrate 3P connected above semiconductor elements 4 of semiconductor device 101 in the first embodiment. That is, insulating substrate 3 in semiconductor device 201 in FIG. 9 is a substrate generally called PCB (Printed Circuit Board), and is in charge of circuit wiring of semiconductor device 201. In addition, since conductor substrates 3P1 and 3P2 are arranged above and below insulating layer 3C to sandwich insulating layer 3C therebetween in insulating substrate 3, a wide variety of wiring patterns can be formed by changing the layout of conductor substrates 3P1 and 3P2 as appropriate. Further, since insulating substrate 3 has a plurality of conductor substrates 3P1 and 3P2, it is possible to connect a portion of one of these to a collector of a transistor included in semiconductor element 4, for example, and connect another portion thereof to an emitter of the transistor, for example. It is possible to arrange the portion of conductor substrate 3P1 or 3P2 connected to the collector and the portion of conductor substrate 3P1 or 3P2 connected to the emitter to be close to each other and to be substantially parallel to each other at the same time. Thereby, a magnetic field generated from a circuit surface connected to the collector of the transistor can be canceled by a magnetic field generated from a circuit surface connected to the emitter of the transistor. Therefore, the reliability of semiconductor device 201 which passes a large current can be further enhanced.

Third Embodiment

In the present embodiment, the semiconductor device in accordance with the first or second embodiment described above is applied to a power conversion device. Although the present invention is not limited to a specific power conversion device, a description will be given below of a case where the present invention is applied to a three-phase inverter, as a third embodiment.

Figure 10:
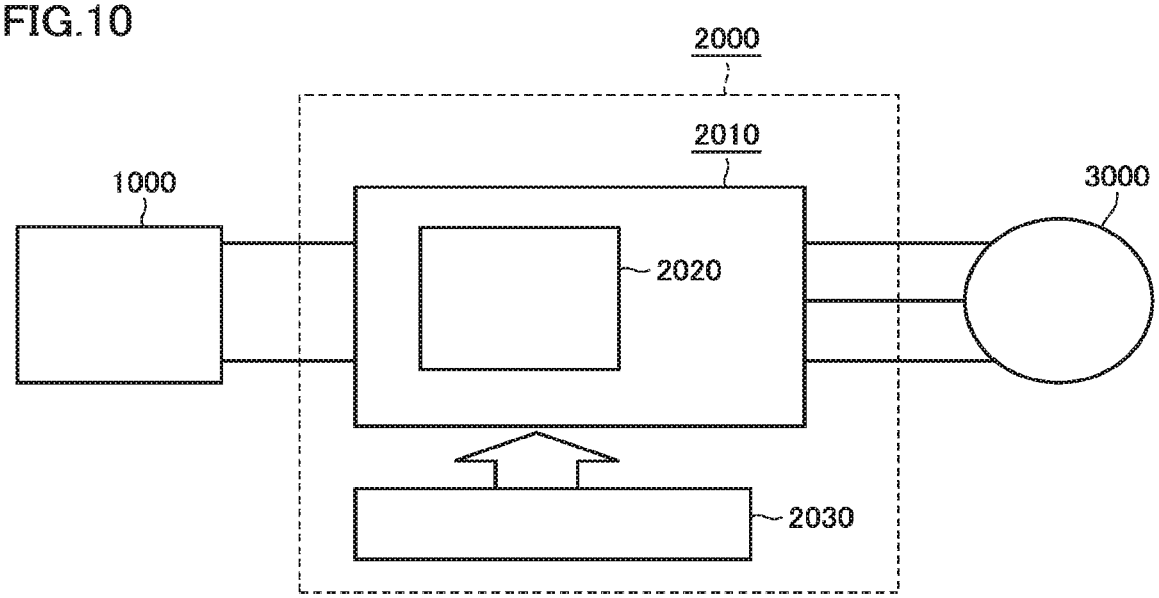
FIG. 10 is a block diagram showing a configuration of a power conversion system to which a power conversion device in accordance with a third embodiment is applied.

FIG. 10 is a block diagram showing a configuration of a power conversion system to which a power conversion device in accordance with the present embodiment is applied. The power conversion system shown in FIG. 10 is configured by a power supply 1000, a power conversion device 2000, and a load 3000. Power supply 1000 is a direct current (DC) power supply, and supplies DC power to power conversion device 2000. Power supply 1000 can be configured by various types of components. For example, power supply 1000 can be configured by a DC system, a solar cell, or a storage battery, or may be configured by a rectification circuit or an AC/DC converter connected to an alternating current (AC) system. Power supply 1000 may also be configured by a DC/DC converter which converts DC power output from a DC system into predetermined power.

Power conversion device 2000 is a three-phase inverter connected between power supply 1000 and load 3000, and converts the DC power supplied from power supply 1000 into AC power and supplies the AC power to load 3000. As shown in FIG. 10, power conversion device 2000 includes a main conversion circuit 2010 configured to convert the input DC power into AC power and output the AC power, and a control circuit 2030 configured to output a control signal for controlling main conversion circuit 2010 to main conversion circuit 2010.

Load 3000 is a three-phase motor driven by the AC power supplied from power conversion device 2000. It should be noted that load 3000 is not limited to specific applications, and load 3000 is a motor mounted in a variety of electric apparatuses. For example, load 3000 is used as a motor for a hybrid vehicle, an electric vehicle, a railroad vehicle, an elevator, or an air conditioner.

The details of power conversion device 2000 will be described below. Main conversion circuit 2010 includes switching elements and reflux diodes (not shown), and converts the DC power supplied from power supply 1000 into AC power and supplies the AC power to load 3000 by switching the switching elements. Although main conversion circuit 2010 may have various types of concrete circuit configurations, main conversion circuit 2010 in accordance with the present embodiment is a two-level three-phase full bridge circuit, and can be configured by six switching elements and six reflux diodes respectively in anti-parallel with the six switching elements. At least any of the switching elements and the reflux diodes of main conversion circuit 2010 is configured by a semiconductor module 2020 corresponding to any semiconductor device 101, 201, 202, 301 in the first and second embodiments described above. Each two switching elements of the six switching elements are connected in series and constitute each pair of upper and lower arms, and each pair of upper and lower arms constitutes each phase (the U phase, the V phase, or the W phase) of the full-bridge circuit. Then, an output terminal for each pair of upper and lower arms, that is, three output terminals of main conversion circuit 2010, are connected to load 3000.

In addition, main conversion circuit 2010 includes a drive circuit (not shown) configured to drive at least any of the switching elements and the reflux diodes described above (hereinafter referred to as the "switching element(s)"). However, the drive circuit may be embedded in semiconductor module 2020, or the drive circuit may be configured separately from semiconductor module 2020. The drive circuit generates drive signals for driving the switching elements of main conversion circuit 2010, and supplies the drive signals to control electrodes of the switching elements of main conversion circuit 2010. Specifically, the drive circuit outputs a drive signal for setting a switching element to an ON state and a drive signal for setting a switching element to an OFF state to the control electrodes of the switching elements, in accordance with the control signal from control circuit 2030 described later. In the case of maintaining the switching element in the ON state, the drive signal is a voltage signal having a value which is more than or equal to a threshold voltage of the switching element (an ON signal), and in the case of maintaining the switching element in the OFF state, the drive signal is a voltage signal having a value which is less than or equal to the threshold value of the switching element (an OFF signal).

Control circuit 2030 controls the switching elements of main conversion circuit 2010 such that desired power is supplied to load 3000. Specifically, based on power to be supplied to load 3000, control circuit 2030 calculates a time when each switching element of main conversion circuit 2010 is to be set to the ON state (an ON time). For example, control circuit 2030 can control main conversion circuit 2010 by PWM control in which the ON time of each switching element is modulated in accordance with a voltage to be output. Then, control circuit 2030 outputs a control command (control signal) to the drive circuit included in main conversion circuit 2010 to output the ON signal to a switching element which is to be set to the ON state and output the OFF signal to a switching element which is to be set to the OFF state at each time. In accordance with the control signal, the drive circuit outputs the ON signal or the OFF signal as a drive signal to the control electrode of each switching element.

In the power conversion device in accordance with the present embodiment, the power module in accordance with the first or second embodiment is applied as each of the switching elements and the reflux diodes of main conversion circuit 2010, and thereby effects such as improved filling properties of sealant 5 into a region between insulating substrate 2 and insulating substrate 3 or conductor substrate 3P can be achieved.

Although the present embodiment has described an example where the present invention is applied to a two-level three-phase inverter, the present invention is not limited thereto, and is also applicable to various types of power conversion devices. Although the present embodiment has described a two-level power conversion device, the present invention may be applied to a three-level or multilevel power conversion device, or may be applied to a single-phase inverter if power is supplied to a single-phase load. The present invention is also applicable to a DC/DC converter or an AC/DC converter if power is supplied to a DC load or the like.

In addition, the power conversion device to which the present invention is applied is not limited to the above case where the load is a motor. For example, the power conversion device can also be used as a power supply device for an electric discharge machine, a laser beam machine, an induction heating cooking device, or a non-contact power feeding system, or can also be used as a power conditioner for a solar power generation system, a power storage system, or the like.

The characteristics described in (the examples included in) the embodiments described above may be applied by being combined as appropriate within a technically consistent range.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: case member; 1A, 2A, 3A, 4A: one main surface; 1B, 2B, 3B, 4B: the other main surface; 1C: inner wall surface; 1D: inner bottom surface; 1F: placement portion; 2: insulating substrate; 2C: heat dissipation metal plate; 2D, 3C: insulating layer; 2G: groove; 2P: metal pattern; 3E: end surface; 3P, 3P1, 3P2: conductor substrate; 4: semiconductor element; 5: sealant; 6A: first joint material; 6B: second joint material; 6C: third joint material; 7: through hole; 8: electrode terminal; 8A: vertically extending portion; 8B: horizontally extending portion; 8C: bent portion; 9: narrow portion; 10: opening; 61: unfilled portion; 101, 201: semiconductor device; 1000: power supply; 2000: power conversion device; 2010: main conversion circuit; 2030: control circuit; 3000: load.

The invention claimed is:

1. A semiconductor device comprising:
an insulating substrate including an insulating layer;
a semiconductor element connected above the insulating substrate;
a conductor substrate connected above the semiconductor element; and
a case member surrounding a region overlapping with the insulating substrate, the semiconductor element, and the conductor substrate in plan view to avoid the region,
a plurality of metal patterns being arranged to be spaced from each other on a main surface of the insulating layer,
a groove being formed between a pair of adjacent metal patterns of the plurality of metal patterns,
a through hole being formed in the conductor substrate at a position overlapping with the groove in plan view,
a sealant being filled into the region surrounded by the case member.

2. The semiconductor device according to claim 1, wherein, in the insulating substrate, the insulating layer is joined to a metal plate to be integrated therewith.

3. The semiconductor device according to claim 2, wherein the groove is formed to linearly extend in plan view between the pair of adjacent metal patterns.

4. The semiconductor device according to claim 3, wherein
the case member has a rectangular planar shape having long sides and short sides, and
the through hole is formed within a region which is arranged at a center when the long sides are each equally divided into three, and is arranged at a center when the short sides are each equally divided into three, of the region surrounded by the case member.

5. The semiconductor device according to claim 4, wherein the through hole has a maximum width of more than or equal to 1 mm and less than or equal to 10 mm in plan view.

6. The semiconductor device according to claim 4, wherein a minimum spacing between the insulating substrate and the conductor substrate is more than or equal to 0.2 mm and less than or equal to 3 mm.

7. The semiconductor device according to claim 3, wherein the through hole has a maximum width of more than or equal to 1 mm and less than or equal to 10 mm in plan view.

8. The semiconductor device according to claim 3, wherein a minimum spacing between the insulating substrate and the conductor substrate is more than or equal to 0.2 mm and less than or equal to 3 mm.

9. The semiconductor device according to claim 2, wherein
the case member has a rectangular planar shape having long sides and short sides, and
the through hole is formed within a region which is arranged at a center when the long sides are each equally divided into three, and is arranged at a center when the short sides are each equally divided into three, of the region surrounded by the case member.

10. The semiconductor device according to claim 9, wherein the through hole has a maximum width of more than or equal to 1 mm and less than or equal to 10 mm in plan view.

11. The semiconductor device according to claim 2, wherein the through hole has a maximum width of more than or equal to 1 mm and less than or equal to 10 mm in plan view.

12. The semiconductor device according to claim 2, wherein a minimum spacing between the insulating substrate and the conductor substrate is more than or equal to 0.2 mm and less than or equal to 3 mm.

13. The semiconductor device according to claim 1, wherein the groove is formed to linearly extend in plan view between the pair of adjacent metal patterns.

14. The semiconductor device according to claim 1, wherein
the case member has a rectangular planar shape having long sides and short sides, and
the through hole is formed within a region which is arranged at a center when the long sides are each equally divided into three, and is arranged at a center when the short sides are each equally divided into three, of the region surrounded by the case member.

15. The semiconductor device according to claim 1, to wherein the through hole has a maximum width of more than or equal to 1 mm and less than or equal to 10 mm in plan view.

16. The semiconductor device according to claim 1, wherein a minimum spacing between the insulating substrate and the conductor substrate is more than or equal to 0.2 mm and less than or equal to 3 mm.

17. The semiconductor device according to claim 1, wherein a spacing between an end surface of the conductor substrate and the case member in a direction along the main surface is more than or equal to 0.25 mm and less than or equal to 3 mm.

18. The semiconductor device according to claim 1, wherein the sealant is an epoxy resin or a silicone resin.

19. A power conversion device comprising:
a main conversion circuit having a power semiconductor device according to claim 1, and configured to convert input power and output the power; and
a control circuit configured to output a control signal for controlling the main conversion circuit to the main conversion circuit.

20. A method for manufacturing a semiconductor device, the method comprising:
joining a conductor substrate above an insulating substrate including an insulating layer to sandwich a semiconductor element therebetween;
placing the insulating substrate, the semiconductor element, and the conductor substrate to be surrounded by a case member; and
sealing the semiconductor element by supplying a sealant into a region surrounded by the case member,
the case member surrounding the region overlapping with the insulating substrate, the semiconductor element, and the conductor substrate in plan view to avoid the region,
forming a plurality of metal patterns spaced from each other on a main surface of the insulating layer,
forming a groove between a pair of adjacent metal patterns of the plurality of metal patterns,
forming a through hole in the conductor substrate at a position overlapping with the groove in plan view.

* * * * *